United States Patent [19]

Birrittella

[11] Patent Number: 4,649,411
[45] Date of Patent: Mar. 10, 1987

[54] GALLIUM ARSENIDE BIPOLAR ECL CIRCUIT STRUCTURE

[75] Inventor: Mark S. Birrittella, Phoenix, Ariz.

[73] Assignee: Motorola, Inc., Schaumburg, Ill.

[21] Appl. No.: 682,729

[22] Filed: Dec. 17, 1984

[51] Int. Cl.[4] ............................................. H01L 29/72
[52] U.S. Cl. ......................................... 357/36; 357/49;
357/16; 357/50; 357/56; 357/89; 357/46;
357/48; 357/54
[58] Field of Search .................... 357/49, 16, 50, 56,
357/89, 46, 48, 36, 54

[56] References Cited

U.S. PATENT DOCUMENTS

| | | | |
|---|---|---|---|
| 4,046,605 | 9/1977 | Nelson et al. | 357/48 |
| 4,119,994 | 10/1978 | Jain et al. | 357/34 |
| 4,204,130 | 5/1980 | Harris | 357/36 |
| 4,333,227 | 6/1982 | Horng et al. | 357/50 |
| 4,380,774 | 4/1983 | Yoder | 357/16 |
| 4,450,468 | 5/1984 | Nishizawa et al. | 357/58 |

OTHER PUBLICATIONS

Asbeck et al., "ECL Implemented w/ HBT's," *Tech. Dig., IEEE GaAs IC Sym.*, 1983, 10/83, pp. 170-173.
Asbeck et al., "Appl. of HBT's to High Speed, Small-Scale Dig., IC's," *Tech. Dig. IEEE GaAs IC Sym.*, 1984, 10/84, pp. 133-136.
Lineback, "Buried Oxide Marks Route to SOI Chips," *Electronics Week*, Oct. 1, 1984, pp. 11-12.
Asbeck et al., "(Ga,Al)As/GaAs Bipolar Trans. for Dig. IC's," *IEDM 81, Tech. Dig.*, Dec. 1981, pp. 629-632.
Asbeck et al., "GaAs/(Ga,Al)As Heterojunc. Bipolar Trans. w/ Buried Oxygen-Implanted Iso. Layers," Rockwell International, abstract, (admitted prior art).
Eden et al., "ICs: The Case for GaAs," *IEEE Spectrum*, 12/83, pp. 30-37.

*Primary Examiner*—Martin H. Edlow
*Assistant Examiner*—William A. Mintel
*Attorney, Agent, or Firm*—William E. Koch

[57] ABSTRACT

A gallium arsenide integrated circuit structure is disclosed wherein each transistor has only two of three terminals exposed at the semiconductor surface, thereby decreasing both the area of the structure and parasitic wiring capacitance. A dielectric buried layer overlies a portion of the substrate and isolates a first region from the remaining chip. This first region serves as common terminals of two or more transistors. Aluminum gallium arsenide is formed both above and below the base region for increasing the efficiency of the junction by eliminating the need for a heavily doped emitters, thereby allowing for symmetry of emitter and collector regions both on the semiconductor surface and below.

7 Claims, 2 Drawing Figures

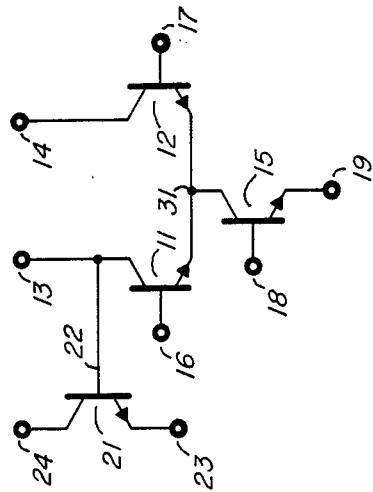
FIG. 1 -PRIOR ART-
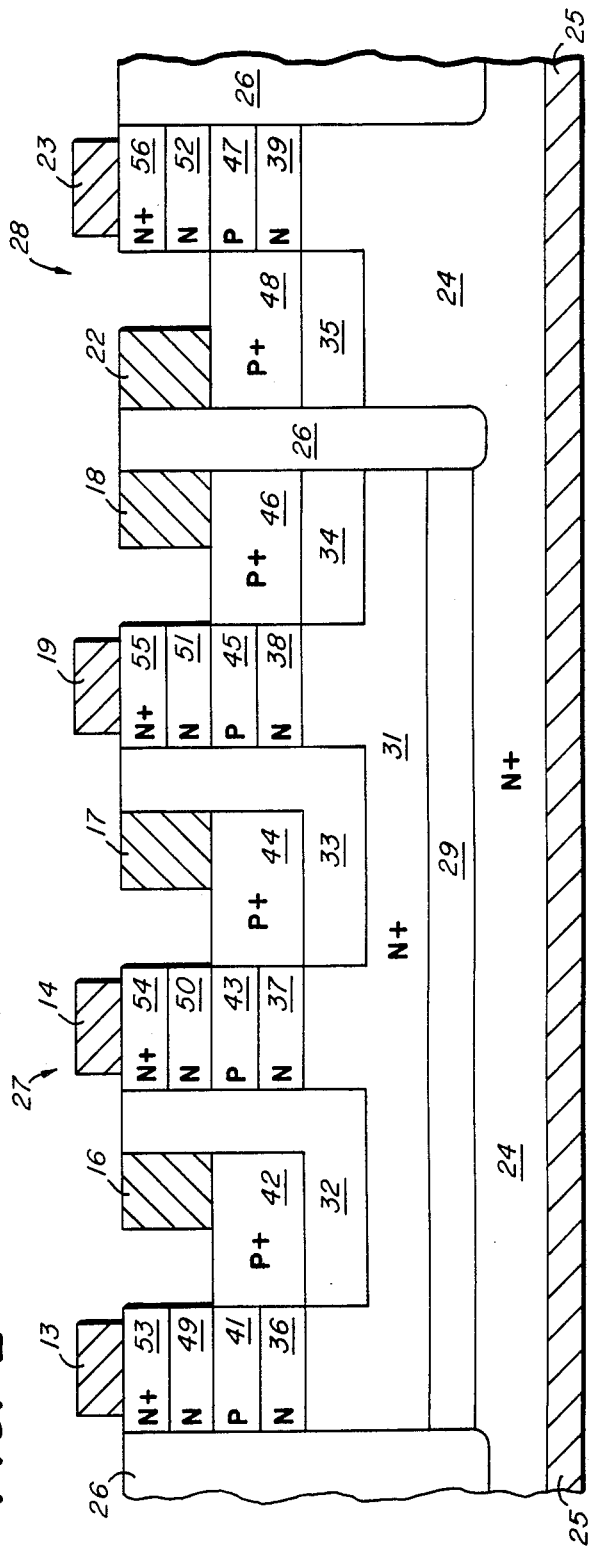
FIG. 2

GALLIUM ARSENIDE BIPOLAR ECL CIRCUIT STRUCTURE

BACKGROUND OF THE INVENTION

1. Field of the Invention

This invention relates generally to monolithically integrated bipolar circuits and, more particularly, to a gallium arsenide (GaAs) integrated circuit having transistors with only two of three terminals exposed at the semiconductor surface.

2. Background Art

The fabrication of a monolithically integrated circuit typically comprises a semi-insulating or high resistivity substrate with an active layer on a surface of the substrate. Conventional techniques for forming the active layer include epitaxial growth, diffusions, ion implantations, etching processes, etc. However, recent advancements in the technology have made it more feasible for certain applications to use conducting material for the substrate for providing power supply voltages to the circuit. Historically, silicon has been the most widely used material for the fabrication of semiconductors, but binary III-V compounds such as GaAs have been recently considered important because of a higher electron mobility providing faster switching, higher transconductance, and less charge storage.

ECL integrated circuits historically have been fabricated in silicon wherein each transistor has its base, collector and emitter electrodes accessible at the surface of the integrated circuit resulting in parasitic wiring capacitance proportional to the number of electrodes and a packing density limited by the number of electrodes. Furthermore, the performance capability of inverted bipolar transistors in silicon is limited since the collector is lightly doped, therefor substantially reducing the efficiency of this junction when operating as an emitter.

Thus, a bipolar ECL structure is needed that decreases the density of the integrated circuit by requiring only two eletrodes for each transistor be accessible at the semiconductor surface, decreases the parasitic wiring capacitance, and allows for transistor operation in the inverse mode.

SUMMARY OF THE INVENTION

Accordingly, it is an object of the present invention to provide an improved integrated circuit structure.

Another object of the present invention is to provide an improved integrated circuit structure fabricated in GaAs.

A further object of the present invention is to provide an improved integrated circuit structure having increased density.

Another object of the present invention is to provide an improved integrated circuit structure that requires fewer transistor electrodes at the semiconductor surface.

Still a further object of the present invention is to provide an improved integrated circuit having reduced wiring capacitance.

Yet another object of the present invention is to provide an integrated circuit structure providing for improved transistor operation in the inverted mode.

In carrying out the above and other objects of the invention in one form, there is provided a monolithic semiconductor integrated circuit structure fabricated of gallium arsenide and having a plurality of semiconductor devices. A substrate is adapted to receive a supply voltage for conducting the supply voltage to at least one of the semiconductor devices. A dielectric region overlies a portion of the substrate for electrically isolating the substrate from at least one of the semiconductor devices. An active layer overlies the substrate and dielectric region and includes emitter, base and collector regions for forming the plurality of semiconductor devices. A buried conductive layer comprises common emitter or collector electrodes of at least two of the semiconductor devices. The portion of the emitter and collector regions immediately adjacent the base region are fabricated of aluminum gallium arsenide for reducing the base current in relation to the collector current, thereby providing for symmetry of collector and emitter regions on the semiconductor surface.

The above and other objects, features, and advantages of the present invention will be better understood from the following detailed description taken in conjunction with the accompanying drawings.

BRIEF DESCRIPTION OF THE DRAWINGS

FIG. 1 is a schematic of a known ECL circuit that includes semiconductor devices used to illustrate the invention.

FIG. 2 is a cross section of the semiconductor die illustrating the preferred embodiment.

DETAILED DESCRIPTION OF THE INVENTION

FIG. 1 shows a conventional ECL circuit that will assist in explaining the invention illustrated in FIG. 2. Differentially coupled NPN transistors 11 and 12 have their collectors connected to terminals 13 and 14 for receiving supply voltage $V_{CC}$, respectively, and their emitters connected together and to the collector of NPN current source transistor 15. One or both of the collectors of transistors 11 and 12 may, alternatively, be coupled to supply voltage $V_{CC}$ by a resistor. Transistors 11 and 12 have their bases connected to terminal 16 for receiving input voltage $V_{IN}$ and terminal 17 for receiving bias voltage $V_{BIAS}$, respectively. Transistor 15 has its base connected to terminal 18 for receiving current source voltage $V_{CS}$ and its emitter connected to terminal 19 for receiving supply voltage $V_{EE}$. A resistor may alternatively be coupled between the emitter of transistor 15 and terminal 19. Emitter follower NPN transistor 21 has its base connected to the collector of transistor 11, its collector connected to terminal 22 for receiving supply voltage $V_{CC}$, and its emitter connected to terminal 23 for receiving supply voltage $V_{EE}$. This circuit operates in a manner well known to those skilled in the art. Simply stated, when the voltage at terminal 16 exceeds the voltage at terminal 17, transistor 12 becomes nonconductive.

FIG. 2 illustrates, in cross-section, a portion of a monolithically integrated semiconductor structure in accordance with the invention. The structure includes transistors 11, 12, 15, and 21 of FIG. 1. It is to be understood that the invention illustrated in FIG. 2 may be configured with NPN or PNP transistors, with or without resistors, and for other circuits such as logic gates. The circuit of FIG. 1 is used for illustration purposes only.

N+ substrate 24 has metallization contact 25 contiguous thereto for connecting to a power supply voltage $V_{CC}$. Substrate 24 is highly doped and therefore has a low resistivity for providing the supply voltage $V_{CC}$ at any location on the chip. Implanted isolations 26 extend into N+ substrate 24 and electrically isolate chip portions 27 (including transistors 11, 12, and 15) and 28 (including transistor 21) from each other and from the remaining chip. Alternate isolation techniques, i.e., an etched groove, may be used. Buried insulating layer 29 is formed by selectively implanting ions, i.e., protons, oxygen, or boron, within substrate 24, and serves to isolate supply voltage $V_{CC}$ on substrate 24 from transistors 11, 12 and 15 in chip portion 27.

N+ layer 31 is a portion of substrate 24 that remains above buried layer 29 and may comprise an additional N+ layer (not shown) epitaxially grown thereupon. Although any of several growth techniques may be used for the layers described herein, molecular beam epitaxy (MBE) is preferred. MBE involves the use of selected molecular beams for condensation on a heated substrate in an ultra-high vacuum environment. Due to the relatively slow growth rate and low substrate temperature, very precise epilayer thicknesses and abrupt doping profiles can be obtained.

N+ layer 31 serves as a common emitter for transistors 11 and 12 and collector for transistor 15 and effectively eliminates one electrode of each transistor from the semiconductor surface. N layer 36, 37, 38 and 39 of aluminum gallium arsenide (AlGaAs) is grown over N+ layer 31 for chip portion 27, and over N+ substrate 24 for chip portion 28. AlGaAs increases the efficiency of the junction by eliminating the need for a heavily doped emitter. This advantage allows for transistor inversion, or structure symmetry, wherein the region on the semiconductor surface, i.e., regions 53, 54, 55 and 56, may serve as either an emitter or a collector, as well as N+ region 31, without the need for fabrication differences. P layer 41, 42, 43, 44, 45, 46, 47 and 48 is grown over layer 36, 37, 38 and 39, and serves as base regions for transistors 11, 12, 15 and 21. N layer 49, 50, 51 and 52 of AlGaAs is grown over P layer 41, 43, 45 and 47 and N+ layer 53, 54, 55 and 56 is grown over N layer 49, 50, 51 and 52. N layer 49, 50, 51 and 52 and N+ layer 53, 54, 55 and 56 are etched to P layer 42, 44, 46 and 48 in a manner known to those skilled in the art as shown in FIG. 2. Isolation regions 32, 33 and 34 are implanted in N+ layer 31 and isolation region 35 is implanted in N+ substrate 24 in a manner similar to buried isolation layer 29 for separating transistors 11, 12, 15 and 21, respectively. Layer 42, 44, 46 and 48 has additional doping injected therein creating a P+ material. Metal regions 13, 14, 19 and 23 are placed over layer 53, 54, 55 and 56, respectively, and metal regions 16, 17, 18 and 22 are placed over layer 42, 44, 46 and 48 respectively, and are numbered to correspond to the terminal it represents in FIG. 1.

The GaAs bipolar structure disclosed utilizes a low resistivity substrate 24. Substrate 24 is used as the most positive power supply source $V_{CC}$ and is isolated from transistors 11, 12 and 15 by an implanted, localized buried isolation layer 29. Transistors 11, 12, 15 and 21 are configured in such a way that only two terminals for each device need appear at the semiconductor surface. This improves device packing density and reduces the need for intra-device metal capacitance which helps to reduce overall wiring capacitance. This configuration allows for the NPN transistors to operate in both up and down modes (either emitter or collector on the semiconductor surface) with similar characteristics, i.e., high $f_T$, beta, for each device. This operation is made possible using the GaAs MBE technology to form AlGaAs layers 36, 37, 38, 39, 49, 50, 51 and 52 on top and underneath P base region 41, 43, 45, and 47. AlGaAs layers 36, 37, 38, 39, 49, 50, 51 and 52 provide high emitter efficiency and hence high beta in both up and down modes. The "would be" parasitic junction (between P regions 42, 44, 46 and N+ region 31, and between P region 48 and substrate 24) are eliminated by additional isolation implants, i.e., regions 32, 33, 34 and 35, after MBE growth. The elimination of these parasitic junctions maintains symmetrical device operation in up and down modes and also providing for high $f_T$ operation in both modes.

I claim:

1. A monolithic semiconductor integrated circuit structure fabricated with a binary III-V compound and having a plurality of transistors, comprising:
    a substrate having a first, a second and a third portion;
    a first region comprising a dielectric material formed over said first portion of said substrate;
    a second region having a first conductivity type formed at a surface of said first region and having a first, a second, a third and a fourth portions;
    a third region comprising a dielectric material formed over said first portion of said second region;
    a fourth region comprising a dielectric material formed over said second portion of said second region;
    a fifth region having a second conductivity type having a first portion formed over at least part of said third region and a second portion formed over said third portion of said second region;
    a sixth region having said second conductivity type having a first portion formed over at least part of said fourth region and a second portion formed over said fourth portion of said second region;
    a seventh region having said first conductivity type formed over said second portion of said fifth region; and
    an eighth region having said second conductivity type formed over said second portion of said sixth region, said fifth region and said seventh region are isolated from said sixth region said eighth region.

2. The monolithic semiconductor integrated circuit structure according to claim 1, further comprising:
    a ninth region having said first conductivity type formed between said third portion of said second region and said second portion of said fifth region; and
    a tenth region having said first conductivity type formed between said fourth portion of said second region and said first portion of said sixth region, said ninth region is isolated from said tenth region.

3. The monolithic semiconductor integrated circuit structure according to claim 1, further comprising:
    an eleventh region having said first conductivity type formed between said second portion of said fifth region and said seventh region; and
    a twelfth region having said first conductivity type formed between said second portion of said sixth region and said eighth region, said eleventh region is isolated from said twelth region.

4. The monolithic semiconductor integrated circuit structure according to claim 1, further comprising:
    a thirteenth region comprising a dielectric material formed over said second portion of said substrate;
    a fourteenth region having said second conductivity type having a first portion formed over said thirteenth region and a second portion formed over said third portion of said substrate; and a fifteenth region having said first conductivity type formed over said second portion of said fourteenth region, said fourth region and said sixth region are isolated from said thirteenth region and said fourteenth region.

5. The monolithic semiconductor integrated circuit structure according to claim 4, further comprising:

a sixteenth region having said first conductivity type formed between said third portion of said substrate and said second portion of said fourteenth region; and a seventeenth region having said first conductivity type formed between said second portion of said fourteenth region and said fifteenth region.

6. The monolithic semiconductor integrated circuit structure according to claim 3 wherein said binary III-V compound comprises gallium arsenide.

7. The monolithic semiconductor integrated circuit structure according to claim 6 wherein said ninth, tenth, eleventh and twelfth regions comprise aluminum gallium arsenide.

* * * * *